(12) United States Patent
Yudasaka et al.

(10) Patent No.: US 7,084,428 B2
(45) Date of Patent: Aug. 1, 2006

(54) TRANSISTOR, INTEGRATED CIRCUIT, ELECTRO-OPTIC DEVICE, ELECTRONIC INSTRUMENT AND METHOD OF MANUFACTURING A TRANSISTOR

(75) Inventors: Ichio Yudasaka, Chino (JP); Masahiro Furusawa, Chino (JP); Takashi Aoki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 28 days.

(21) Appl. No.: 10/717,503

(22) Filed: Nov. 21, 2003

(65) Prior Publication Data

US 2005/0029591 A1   Feb. 10, 2005

(30) Foreign Application Priority Data

Dec. 3, 2002   (JP) .............................. 2002-351112

(51) Int. Cl.
*H01L 29/04*   (2006.01)
(52) U.S. Cl. .................... 257/57; 257/66; 257/354
(58) Field of Classification Search ................ 257/57, 257/59, 347, 352, 353, 354, 66
See application file for complete search history.

(56) References Cited

U.S. PATENT DOCUMENTS

| | | | |
|---|---|---|---|
| 5,621,558 A * | 4/1997 | Shimada et al. ............ 349/130 |
| 6,420,218 B1 * | 7/2002 | Yu .............................. 438/142 |
| 6,441,560 B1 * | 8/2002 | Hunter ..................... 315/169.1 |
| 6,545,319 B1 * | 4/2003 | Deane et al. ................ 257/350 |
| 6,683,350 B1 * | 1/2004 | Kusumoto ................... 257/347 |
| 6,774,393 B1 * | 8/2004 | Murti et al. ................... 257/40 |
| 6,870,225 B1 * | 3/2005 | Bryant et al. ................ 257/347 |
| 2004/0075124 A1 * | 4/2004 | Wu et al. ..................... 257/288 |

FOREIGN PATENT DOCUMENTS

| | | |
|---|---|---|
| JP | A 6-104439 | 4/1994 |
| JP | A 10-032337 | 2/1998 |
| KR | A-2000-0074705 | 12/2000 |

* cited by examiner

*Primary Examiner*—T. N. Quach
(74) *Attorney, Agent, or Firm*—Oliff & Berridge, PLC

(57) ABSTRACT

There is provided a transistor and a method of manufacturing this transistor that allow a high degree of freedom when designing a wiring structure and also allow an improvement in product quality to be achieved. The transistor includes a source area, a drain area, and a channel area, each of which are formed by semiconductor films, and also a gate insulating film and a gate electrode. The semiconductor film containing the source area and the semiconductor film containing the drain area are formed separately sandwiching both sides of an insulating member. The semiconductor film containing the channel area is formed on top of the insulating member.

24 Claims, 10 Drawing Sheets

TRANSISTOR, INTEGRATED CIRCUIT, ELECTRO-OPTIC DEVICE, ELECTRONIC INSTRUMENT AND METHOD OF MANUFACTURING A TRANSISTOR

BACKGROUND OF THE INVENTION

1. Field of the Invention

The present invention relates to a transistor that can be suitably used in an electro-optic device such as liquid crystal display device, an electroluminescent display device, and an electrophoretic display device as well as in an integrated circuit and to a method of manufacturing the transistor. The present invention also relates to an integrated circuit, an electro-optic device, and an electronic instrument that use this transistor.

Priority is claimed on Japanese application No. 2002-351112, filed Dec. 3, 2002, the content of which is incorporated herein by reference.

2. Description of Related Art

Generally, a transistor is formed by a source area, a drain area, and a channel area that are each formed by a semiconductor film, as well as a gate insulating film and a gate electrode. In a typical transistor structure a semiconductor film is formed by creating a source area, a drain area, and a channel area on a substrate and then a gate insulating film and a gate electrode are placed in that order on the semiconductor film (for example, see Japanese Patent Application Laid-Open (JP-A) No. 10-32337 (see FIG. 6))

In a transistor having the above described structure, a semiconductor film is formed in an island shape on a substrate and a gate insulating film is formed on top of this giving the surface of the gate insulating film bumps and indentations. These bumps and indentations can be a restriction when optimizing the wiring structure.

Further, in a transistor having the above described structure, because a gate electrode is formed extending along the top of the gate insulating film a difference in level is created between the gate electrode and the wiring thereof. The difference in level between the electrode and the wiring tends to cause current leaks and other degradation.

The present invention was conceived in view of the above circumstances and it is an object thereof to provide a transistor that permits a greater degree of freedom when designing the wiring structure, and that also provides an improved product quality, as well as a manufacturing method thereof.

It is a further object of the present invention to provide an integrated circuit, an electro-optic device, and an electronic instrument that enable an improvement in product quality and performance to be achieved.

SUMMARY OF THE INVENTION

In order to attain the above objects, according to an aspect of the present invention, there is provided a transistor comprising a source area, a drain area, and a channel area, each of which are formed by semiconductor films, and a gate insulating film, and a gate electrode, wherein the semiconductor film containing the source area and the semiconductor film containing the drain area are formed separately at both sides of an insulating member, and the semiconductor film containing the channel area is formed over the insulating member.

According to this transistor, an optimization of the position and configuration of a semiconductor film containing a channel area can be easily achieved, and the degree of freedom when designing the wiring structure is improved.

Preferably, in the above transistor, positions of end surfaces of the insulating member, the semiconductor film containing the source area, and the semiconductor film containing the drain area over the channel area side thereof are substantially the same height as one another.

In this case, the surface where the semiconductor film containing the channel area is formed can be flattened allowing the optimization when designing the position and configuration of the semiconductor film containing the channel area to be achieved with an even greater degree of flexibility.

Preferably, the above described transistor further comprises a first insulating layer that contains the insulating member and that partitions respective areas where the semiconductor film containing the source area and the semiconductor film containing the drain area are formed; and a second insulating layer laminated over the first insulating layer that partitions an area where the semiconductor film containing the channel area is formed, wherein the gate insulating film is laminated over the channel area and the second insulating layer.

By employing this type of structure the surface where the gate insulating layer is formed can be flattened. As a result, it is possible to achieve a flattening of the gate insulating layer. By flattening the gate insulating layer any difference in the level of the gate electrode is reduced and an improvement in product quality such as a reduction in leakage current and prevention of degradation can be achieved.

According to another aspect of the present invention, there is provided an integrated circuit comprising the transistor of the present invention.

According to this integrated circuit, because the degree of freedom when designing the wiring structure of the transistor is improved an improvement in performance and product quality can be achieved.

According to still another object of the present invention, there is provided an electro-optic device including a transistor as a switching element and an electro-optic layer driven by the transistor, the transistor comprising a source area, a drain area, and a channel area, each of which are formed by semiconductor films, and also a gate insulating film, and a gate electrode, wherein the semiconductor film containing the source area and the semiconductor film containing the drain area are formed separately at both sides of and sandwiching an insulating member, and the semiconductor film containing the channel area is formed over the insulating member.

According to this electro-optic device, because the degree of freedom when designing the wiring structure of the transistor is improved an improvement in performance and product quality can be achieved.

According to still another aspect of the present invention, there is provided an electronic instrument including a display unit, the display unit comprising the electro-optic device of the present invention.

According to this electronic instrument, by improving the performance and product quality of the electro-optic device the display performance and product quality is improved.

According to yet another aspect of the present invention, there is provided a method of manufacturing a transistor including a source area, a drain area, and a channel area, each of which are formed by semiconductor films, and a gate insulating film, and a gate electrode, comprising the steps of forming the semiconductor film containing the source area and the semiconductor film containing the drain area separately at both sides of and sandwiching an insulating member, and forming the semiconductor film containing the channel area over the insulating member.

According to this method of manufacturing a transistor a transistor is manufactured in which the semiconductor film containing the source area and the semiconductor film containing the drain area are formed separately, and the semiconductor film containing the channel area is formed on top of the insulating member. Therefore, when designing the transistor, it is easy to optimize the position and configuration of the silicon film containing the channel area, thereby improving the degree of freedom when designing the wiring structure.

Preferably, in the above described method, the step of forming the semiconductor film containing the source area and the semiconductor film containing the drain area comprises the steps of forming a first insulating layer that partitions a predetermined area; and placing semiconductor material containing impurities in the area partitioned by the first insulating layer.

With this method a source area and a drain area are formed as semiconductor films containing impurities sandwiching an insulating member in an area partitioned by the first insulating layer.

Preferably, in the above described method, the step of forming the semiconductor film containing the channel area comprises the steps of forming a second insulating layer that partitions a predetermined area on the first insulating layer; placing semiconductor material in the area partitioned by the second insulating layer; and forming the gate insulating film on the semiconductor film containing the channel.

With this method the surface where the gate insulating layer is formed can be flattened. As a result, it is possible to achieve a flattening of the gate insulating layer. By flattening the gate insulating layer any difference in the level of the gate electrode is reduced and an improvement in product quality such as a reduction in leakage current and prevention of degradation can be achieved.

Preferably, in the above described method, when at least one of the semiconductor film containing the source area, the semiconductor film containing the drain area, the semiconductor film containing the channel area, and the gate electrode is formed, a droplet discharge method (known as an inkjet method) is employed in which material for its forming is discharged in droplet form.

With this method there is little wastage of material and a predetermined quantity of material can be reliably placed in a predetermined position.

BRIEF DESCRIPTION THE DRAWINGS

DETAILED DESCRIPTION OF THE INVENTION

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description and is only limited by the scope of the appended claims.

A description will now be given of the embodiments of the present invention with reference made to the drawings.

Figure 1:
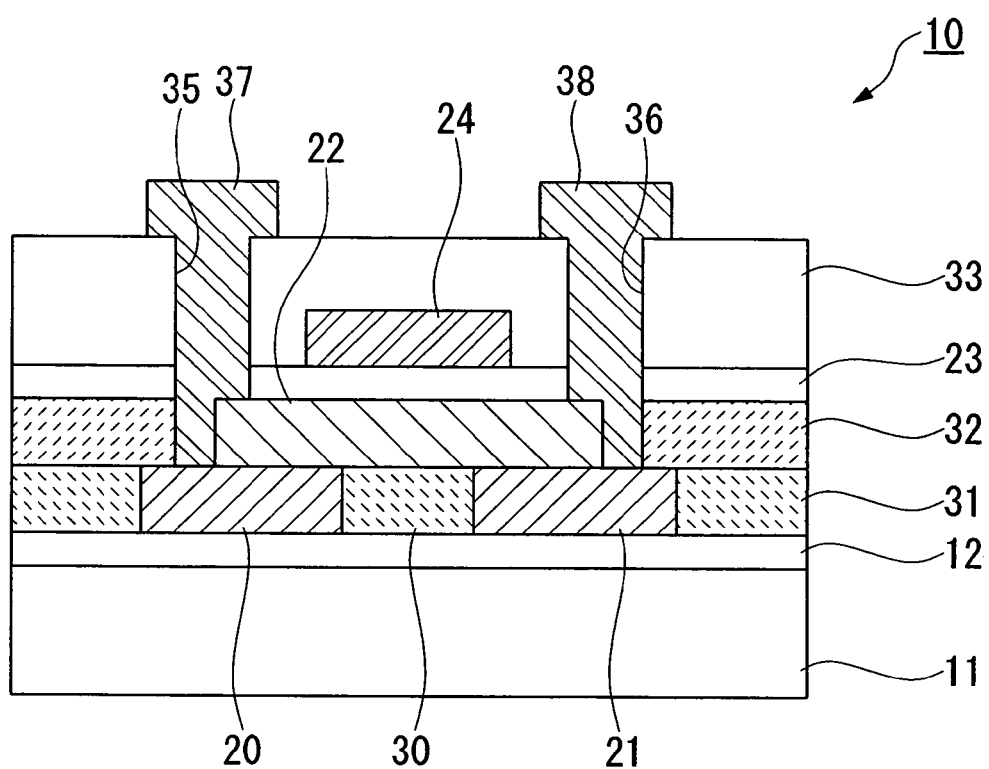
FIG. 1 is a typical cross-sectional view showing an example of an embodiment of the transistor according to the present invention.

FIG. 1 is a typical cross-sectional view showing an example of an embodiment of the transistor according to the present invention. In FIG. 1, a backing insulating film 12 is formed on a substrate 11, and a transistor 10 that uses other crystalline silicon is formed on the substrate 11. The transistor 10 is provided with a source area 20 and a drain area 21 that are formed from silicon film in which impurities have been dispersed at a high density, a channel area 22 formed from silicon film, a gate insulating film 23, and a gate electrode 24. Note that the purpose of the backing insulating film 12 is to prevent any contamination from the substrate 1 and to prepare a surface state on which the silicon films 20 and 21 can be formed, however, in some cases the backing insulating film 12 is omitted.

In the present example, the silicon film 20 that contains the source area and the silicon film 21 that contains the drain area are formed separately on both sides of an insulating member 30. More specifically, a first insulating layer 31 having banks that partition predetermined areas is formed on the backing insulating film 12, and the silicon film 20 containing the source area and the silicon film 21 containing the drain area are each formed on the areas partitioned by the banks of the first insulating layer 31. The silicon film 20 and the silicon film 21 are both enclosed by the banks of the first insulating layer 31 and are positioned separated from each other on either side of a portion of the banks. Note that the insulating member 30 is a portion of the banks of the first insulating layer 31. The first insulating layer 31 is formed, for example, from silicon oxide film.

The first insulating layer 31, the silicon film 20 containing the source area, and the silicon film 21 containing the drain area have substantially the same height as each other on the surfaces (end surface positions) thereof on the side of the silicon film 22 containing the channel area.

The channel area 22 is positioned on top of the insulating member 30 located between the silicon film 20 containing the source area and the silicon film 21 containing the drain area. More specifically, a second insulating layer 32 having banks that partition predetermined areas is formed on the first insulating layer 31, and the silicon film 22 containing the channel area is formed in an area partitioned by the banks of the second insulating layer 32. The second insulating layer 32 is formed, for example, from silicon oxide film.

The surfaces of the second insulating layer 32 and the silicon film 22 containing the channel area on the side of the gate electrode 24 have substantially the same height.

The gate insulating film 23 is placed on top of the silicon film 22 containing the channel area and the second insulating layer 32, and between the channel area 22 and the gate electrode 24.

The gate electrode 24 is placed on top of the gate insulating film 23 and faces the channel area 22 sandwiching the gate insulating film 23. The gate electrode 24 has approximately the same width as that of the insulating member 30 positioned between the source area 20 and the drain area 21 or is formed slightly wider than the insulating member 30. The gate electrode 24 is formed extending in an orthogonal direction relative to the surface of the paper showing the drawing.

A third insulating layer 33 is formed as an interlayer insulating film on top of the gate electrode 24 and second insulating layer 32 so as to cover the gate electrode 24. Contact holes 35 and 36 are formed in the second insulating layer 32, the third insulating layer 33, and the gate insulating film 23. A source electrode 37 connected via the contact hole 35 to the source area 20 and a drain electrode 38 connected via the contact hole 36 to the drain area 21 are formed respectively on the third insulating layer 33.

Note that, in FIG. 1, the source area and the drain area correspond respectively to 20 and 21, however, by performing a heat processing such as laser annealing in a process after the channel areas 22 are formed, impurities in the silicon films 20 and 21 are also dispersed into the silicon film 22 adjacent to these areas. Therefore, in a broad definition, the source area includes the silicon film 20 and the silicon film 22 directly above the silicon film 20, and the drain area includes the silicon film 21 and the silicon film 22 directly above the silicon film 21.

In the transistor 10 having the above described structure, because the silicon film 20 containing the source area and the silicon film 21 containing the drain area are positioned separately on both sides of and sandwiching the insulating member 30, and because the silicon film 22 containing the channel area is positioned on the insulating member 30, it is easy to optimize the position and configuration of the silicon film 22 containing the channel area, thereby achieving a high degree of freedom when designing the wiring structure. For example, the width and thickness of the silicon film 22 as well as the positioning thereof can be determined with flexibility.

Moreover, in the present example, because the surfaces of the insulating member 30, the silicon film 20 containing the source area, and the silicon film 21 containing the drain area are substantially the same height as each other on the channel area 22 side, the surface where the silicon film 22 containing the channel area is formed can be flattened, and it is possible to even more flexibly optimize the position and configuration of the silicon film 22 containing the channel area.

Moreover, because the surfaces of the silicon film 22 containing the channel area and the second insulating layer 32 on the side of the gate electrode 24 have substantially the same height, the surface where the gate insulating film 23 is formed can be flattened resulting in the gate insulating film 23 being flattened. By flattening the gate insulating film 23 the difference in level between the gate electrode 24 and the other wiring on top of the gate insulating film 23 is reduced, and an improvement in product quality, such as a reduction in leakage current and prevention of degradation is achieved.

Next, a description will be given of an example in which the manufacturing method of the transistor of the present invention is applied to a process for manufacturing the above described transistor 10 with reference made to FIGS. 2 to 5.

Figure 2A:
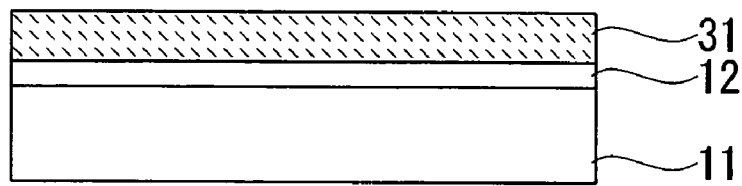
FIGS. 2A to 2D are views showing a manufacturing process of the transistor of the present invention.

Firstly, as is shown in FIG. 2A, the backing insulating film 12 is formed from silicon oxide film on the substrate 11 by a plasma CVD method using, where necessary, a raw material such as tetraethoxysilane (TEOS) or oxygen gas. Instead of silicon oxide film, it is also possible to provide a silicon nitride film or a silicon oxide nitride film as the backing insulating film.

Using the same method as was employed for the backing insulating film 12, the first insulating layer 31 is then formed from silicon oxide film on the substrate 11 on which the backing insulating film 12 has been formed.

It is also possible for the backing insulating film 12 and the first insulating layer 31 to be formed by a spin coating method, a dip coating method, a roll coating method, a curtain coating method, a spray coating method, or a droplet discharge method, or the like. In this case, for example, after a liquid material obtained by mixing polysilazane in a solvent has been coated on the substrate, the coated film is changed into a silicon oxide film by heat processing.

Here, the term polysilazane is a generic term for polymers having an Si—N bond. One polysilazane is $[SiH_2NH]$ (with n being a positive integer) which is known as polyperhydrosilazane. If heat processing is performed on a liquid material obtained by mixing polysilazane in a solution such as xylene in an atmosphere containing water vapor or oxygen, the liquid material changes to silicon oxide. Polysilazane has excellent crack resistance and is resistant to oxygen plasma, and even in a single layer can be used as a comparatively thick insulating film.

Figure 2B:
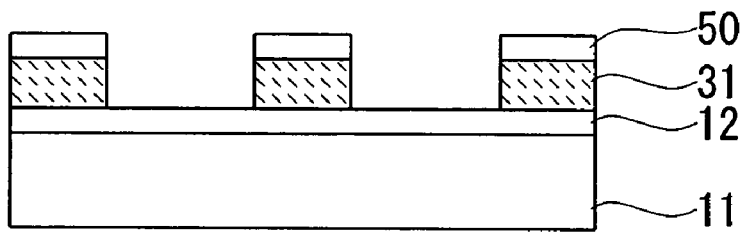

Next, as is shown in FIG. 2B, by patterning using a photolithographic method, unnecessary portions of the first insulating layer 31 are removed so as to create the areas (concave portions) for forming the silicon film for the source and drain. Namely, after a resist film 50 has been formed on the first insulating layer 31 unnecessary portions of the resist film 50 are removed by patterning. Unnecessary portions of the first insulating layer 31 are further removed by etching. As a result, banks that partition areas for forming the above described silicon films are formed on the first insulating layer 31. Note that if the surface of the resist film 50 is made incompatible by a method such as exposing it to plasma using gas containing fluorine, the subsequent thin film formation step using a droplet discharge method is made easier.

Figure 2C:
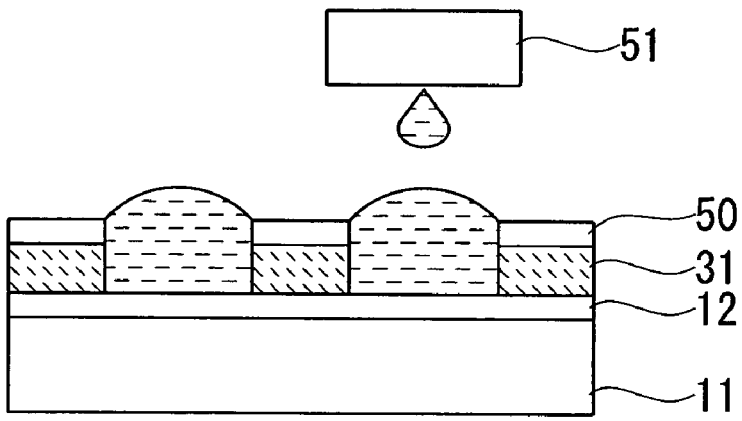

Next, as is shown in FIG. 2C, a material used to form the silicon film for the source and drain is placed in the areas (concave portions) partitioned by the banks of the first insulating layer 31. At this time, in the present example, a liquid material is used as the material for forming the silicon film and this liquid material is put in place using a droplet discharge method. Namely, while a head 51 in which is provided a discharge nozzle is being moved relatively to a substrate 11, the liquid material is discharged in droplet form onto the substrate 11. As a result, the liquid material is placed in the concave portions of the first insulating layer 31, which are the areas for forming the silicon film.

Examples of the discharge technique of the droplet discharge method include a charge controlled method, a pressure vibration method, an electro-mechanical transduction method, an electro-thermal transduction method, an electrostatic absorption method, and the like. In the charge controlled method, a charge is imparted to the material by a charge electrode and the material is discharged from the nozzle while the discharge direction of the material is controlled by deflecting electrodes. In the pressure vibration method, ultra high pressure (approximately 30 kg/cm$^2$) is applied to the material so that the material is discharged towards the distal end of the nozzles. When no control voltage is applied the material is discharged straight out from the nozzle. If control voltage is applied electrostatic repulsion occurs between the material and the material is not discharged from the nozzle while being spattered in all directions. In the electro-mechanical transduction method (a piezoelectric method), the ability of piezoelectric elements to deform when they receive pulse mode electrical signals is used. As a result of the deformation of the piezoelectric element, pressure is applied via a flexible substance to a space where the material is stored. The material is thereby pushed out from this space and is discharged from the nozzle. In the electro-thermal transduction method, bubbles are generated by rapidly vaporizing the material using a heater provided in the space where the material is stored. The material in the space is then discharged by the pressure from the bubbles. In the electrostatic absorption method, micro pressure is applied to the space where the material is stored to form a meniscus on the material in the nozzle. In this state the material is drawn out after electrostatic attraction is applied. In addition to these, technologies such as a method that uses a change in the viscosity of a fluid created by an electric field, or a method in which the material is discharged by electric sparks may be employed. Among these methods, the electro-mechanical transduction method (the piezoelectric method) has the advantage that because no heat is applied to the material there are no effects on the composition of the material.

A droplet discharge method has the advantages that there is little wastage of material and that a predetermined quantity of material can be reliably placed in a predetermined position. Note that the quantity of one droplet of liquid material (i.e., a fluid) discharged using a droplet discharge method is, for example, 1 to 300 nanograms.

A liquid material containing impurities beforehand in addition to silicon atoms is used as the liquid material of the silicon film used for the source and drain. An example is a compound obtained by dissolving a silicon compound and a substance containing boron as an impurity (for example, decaborane) in an organic solvent such as toluene.

Silicon compounds typically have a ring system represented by SinXm (here, n is an integer of 5 or greater, m is an integer of either n or 2n–2 or 2n, X is a hydrogen atom and/or a halogen atom). As the above described typical SinXm silicon compound, one in which n is 5 or more and 20 or less is preferable, and one in which n is 5 or 6 is more preferable. If n is less than 5 handling is difficult due to the silicon compound itself becoming unstable as a result of distortion caused by the ring structure. If n is greater than 20 the solubility of the silicon compound in a solvent is reduced due to the cohesive power of the silicon compound. This decreases the number of solvents that can be selected for actual use. Moreover, it is possible to include silicon compounds such as n-pentasilane, n-hexasilane, and n-heptasilane in a solvent that requires as a necessary component the typical silicon compound having a ring system represented by SinXm that is described above.

The composition of the compounds in the decaborane are adjusted such that the ratio of B atoms in the decaborane is approximately from 0.001% to 1% relative to the Si atoms in the silicon compound.

Figure 2D:
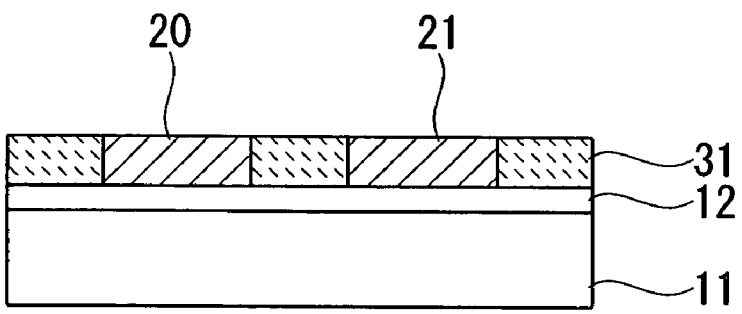

Next, as is shown in FIG. 2D, a silicon film having high density impurity areas is formed by peeling off the resist film 50 and then solidifying the liquid material in the silicon film for the source and drain by heat processing. As a result, the silicon film 20 containing the source area and the silicon film 21 containing the drain area are formed separately on both sides sandwiching a portion of the first insulating layer 31.

Here, in the present embodiment, by this solidification of the silicon film, the positions of the top surfaces of each of the first insulating layer 31, the silicon film 20 containing the source area, and the silicon film 21 containing the drain area are at substantially the same height as each other. The heights of both the silicon film 20 and the silicon film 21 are adjusted by controlling the total discharge quantity of the material discharged onto the respective formation areas when each of the formative materials is being put in place. Namely, in the present example, the total discharge quantities of liquid material in both the area where the silicon film 20 and the area where the silicon film 21 are formed are each determined such that the positions of the top surfaces of the silicon film 20 and the silicon film 21 are the same as that of the first insulating layer 31.

When forming a silicon film containing high density impurity areas, it is also possible to first form the silicon film and then subsequently introduce impurity atoms into the silicon film instead of introducing impurities into the liquid material before forming the silicon film.

To introduce the impurity ions it is possible to employ, for example, an ion doping method in which hydrogen compounds and hydrogen of injected impurity elements are injected using a non-separable mass ion injection device. Alternatively, it is possible to employ an ion implantation method in which only the desired impurity ions are injected using a separable mass ion injection device. A hydride having injected impurities such as, for example, phosphine or diborane diluted in hydrogen to a concentration of approximately 0.1% (PH$_3$ and B$_2$H$_6$ respectively) may be used as the raw material gas for the ion doping. It is also possible when forming the silicon film containing high density impurity areas to form a BSG or PSG film—SOG film on a silicon film and then perform a heat processing such as annealing processing. The heat processing preferably involves performing a heat processing at 300 to 500° C. and then implementing a high temperature—short time heat processing such as lamp annealing or laser annealing. This causes the impurities in the SOG to undergo solid phase diffusion in the silicon film, and for a silicon film having high density impurity areas to be formed.

Figure 3A:
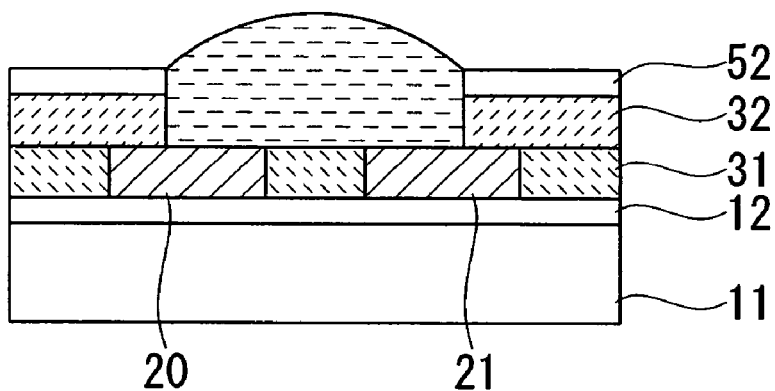
FIGS. 3A to 3C are views showing a manufacturing process of the transistor of the present invention.
Figure 3B:
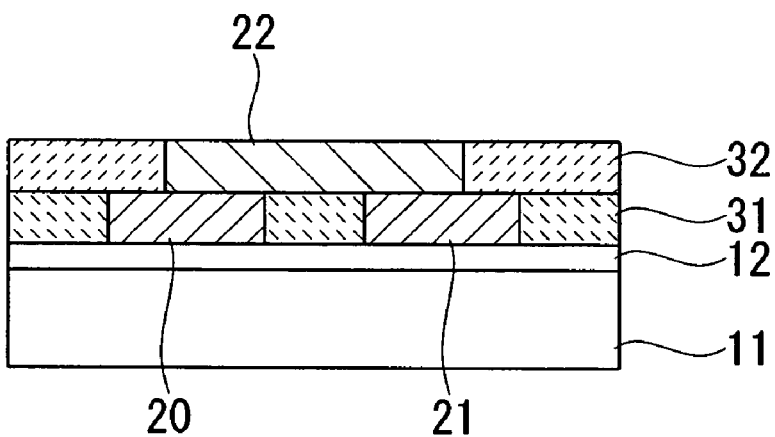

Next, as is shown in FIGS. 3A and 3B, a silicon film 22 containing a channel area is formed on top of the silicon film 20 containing the source area, the silicon film 21 containing the drain area, and the first insulating layer 31. In this example, the formation of the silicon film 22 is the same as the formation of the silicon film 20 and the silicon film 21, described above, and involves forming an insulating layer (the second insulating layer 32) that partitions the areas where the silicon film 22 is formed, placing a liquid formation material in the areas (concave portions) partitioned by the insulating layer 32, and then solidifying the liquid material by performing heat processing thereon.

Namely, as is shown in FIG. 3A, firstly, the second insulating layer 32 is laminated on top of the silicon film 20, the silicon film 21, and the first insulating layer 31. The second insulating layer 32 is formed in the same manner as the backing insulating film 12 from a silicon oxide film by a plasma CVD method, an SOG method, or by heat converting a coated film of the liquid material obtained by mixing polysilazane in a solvent.

Subsequently, by patterning using a photolithographic method or the like, unnecessary portions of the second insulating layer 32 are removed, and the area (i.e., concave portion) for forming the silicon film used for the channel is formed. Namely, after a resist film 52 has been formed on the second insulating layer 32 unnecessary portions of the resist film 52 are removed by patterning. Unnecessary portions of the second insulating layer 32 are further removed by etching. As a result, banks that partition an area for forming the silicon film used for the channel are formed on the second insulating layer 32. Note that it is preferable if the surface of the resist film 52 is made incompatible by a method such as exposing it to plasma using gas containing fluorine.

Next, the material to form the silicon film is placed in the areas for forming the silicon film partitioned by the banks of the second insulating layer 32. At this time, in the present example, a liquid material is used as the material for forming the silicon film and this liquid material is put in place using the above described droplet discharge method.

A solution that contains, for example, the aforementioned silicon compound is used as the liquid material for the silicon film for the channels. The concentration of this silicon compound solution is approximately 1 to 80 percent by weight, and can be adjusted in accordance with the desired silicon film thickness. If the concentration exceeds 80% precipitation tends to occur and a uniform coating film cannot be obtained. According to necessity and provided the target functions are not impaired, the silicon compound solution can also contain minute additions of surface tension modifiers such as fluorine systems, silicon systems, and nonion systems. Nonion based surface tension modifiers improve the wettability of the solution on the coating object, improve the leveling of the coated film, and are also useful in preventing minute irregularities being generated in the coated film.

The viscosity of the silicon compound solution is normally in the range of 1 to 100 mPa·s, and can be suitably selected in accordance with the coating position and the desired coated film thickness. If the viscosity exceeds 100 mPa·s, it becomes difficult to obtain a uniform coated film.

Furthermore, the solvent used in the above solution normally has a vapor pressure at room temperature of 0.001 to 100 mmHg. If the vapor pressure is higher than 100 mmHg, the solvent may evaporate too soon if the coated film is being formed by coating, making it difficult to form a good coated film. If, however, the solvent has a vapor pressure of less than 0.001 mmHg, drying takes too long and solvent tends to remain in the coated film of the silicon compound. This makes it difficult to obtain a good silicon film in the later heat processing. Furthermore, it is preferable that the solvent is a hydrocarbon based solvent or an ethyl based solvent from the standpoints of solubility of the silicon compound and stability of the solution. More preferable as the solvent is a hydrocarbon based solvent.

Subsequently, as is shown in FIG. 3B, after the resist film 52 has been peeled off, the liquid material of the silicon film for the channel 22 is solidified by heat processing. When the above described silicon compound solution is solidified, the temperature of the heat processing is, for example, 100 to 500° C. Solvent in the coated film is removed by this heat processing and the ring of the ring silicon compound is opened. In addition, the silicon compound is decomposed and a solid silicon film is formed. By then performing a further high temperature—short time heat processing such as lamp annealing, laser annealing, or flash annealing again, the crystallization properties, the compactness, and the adhesive properties with other films are improved. The processing temperature of this second heat processing in the case of laser annealing is desirably raised to at least a temperature at which the silicon film melts, while the time the heat is applied for is preferably approximately 10 to 80 ns. In the case of lamp annealing, the temperature is preferably raised to approximately 500 to 1000° C. and heat is preferably applied for approximately several seconds to several tens of seconds. In the case of flash annealing, the temperature is preferably one at which the silicon film melts and heat is applied for several microseconds. As a result of this processing a silicon film 22 containing a channel area and having good crystallization properties is formed.

Figure 3C:
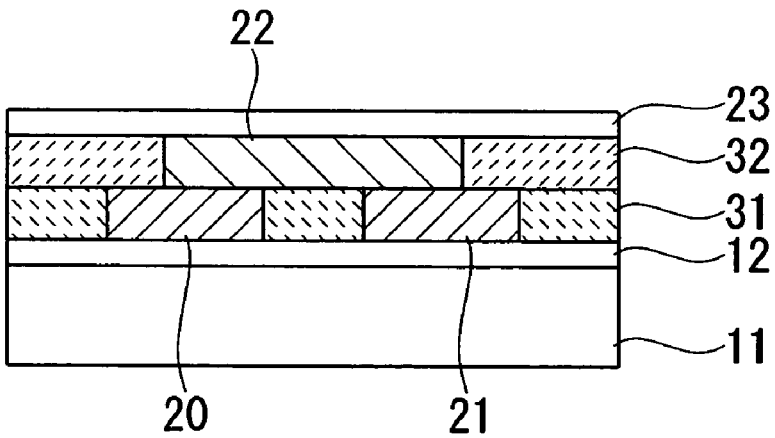

Next, as is shown in FIG. 3C, the gate insulating film 23 is laminated on top of the silicon film 22 containing the channel area and the second insulating layer 32. In the same way as for the backing insulating film 12, the gate insulating film 23 is formed, for example, from silicon oxide film and is formed by a plasma CVD method or by heat converting a coated film of the liquid material obtained by mixing polysilazane in a solvent.

Figure 4A:
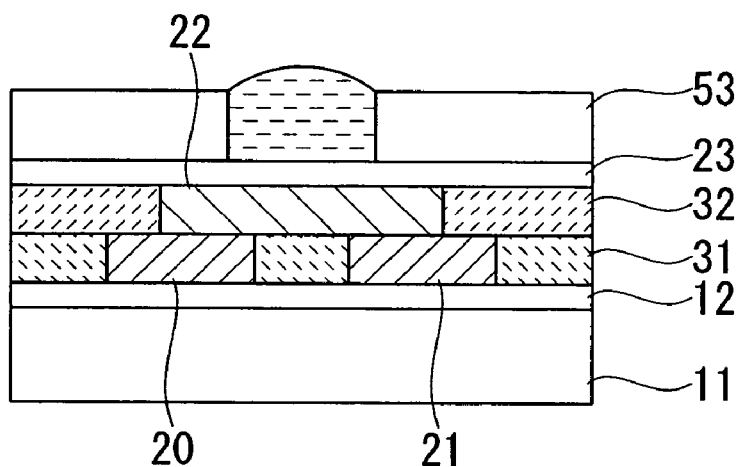
FIGS. 4A to 4C are views showing a manufacturing process of the transistor of the present invention.
Figure 4B:
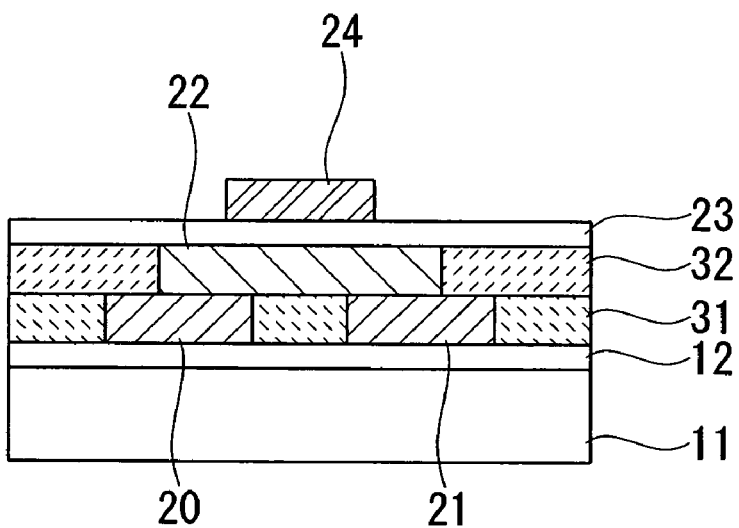

Next, as is shown in FIGS. 4A and 4B, a gate electrode 24 containing doped silicon, a silicide film and a metal such as aluminum, tantalum, molybdenum, titanium, tungsten, copper, silver, or the like is formed on the gate insulating film 23.

Namely, as is shown in FIG. 4A, after the resist film 53 has been formed on the gate insulating film 23 unnecessary portions of the resist film 53 are removed by patterning to form an area (i.e., a concave portion) for forming the gate electrode. Thereafter, material for forming the gate electrode is placed in the formation area. In the present example, a liquid material is used as the material for forming the gate electrode and this liquid material is put in place using the above described droplet discharge method. After the liquid material has been put in place, solvent contained in the liquid material is removed by heat processing to form a solid gate electrode film. Note that a liquid material obtained by dispersing fine particles of a metal material in an organic solvent can be used as the above described liquid material. For example, a liquid material obtained by dispersing fine particles of silver having a particle diameter of 8 to 10 nm in an organic solvent such as terpineol or toluene can be used. In addition to the aforementioned silver (Ag), Au, Al, Cu, Ni, Co, Cr, ITO and the like can be used as the electroconductive fine particles.

Next, as is shown in FIG. 4B, after the above described heat processing, the resist film 53 is peeled off. Thereafter, by performing further heat processing the gate electrode film is compacted. As a result, the gate electrode 24 is formed on the gate insulating film 23.

Figure 4C:
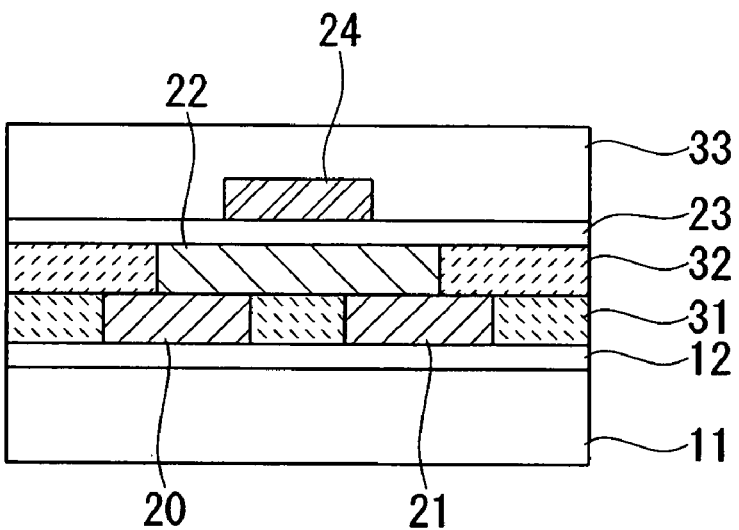

Next, as is shown in FIG. 4C, a third insulating layer 33 is formed on the gate insulating film 23 and the gate electrode 24. In the same way as for the backing insulating film 12, the third insulating layer 33 is formed, for example, from silicon oxide film and is formed by a plasma CVD method or by heat converting a coated film of the liquid material obtained by mixing polysilazane in a solvent. By performing further heat processing each of the insulating films can be further compacted.

Figure 5A:
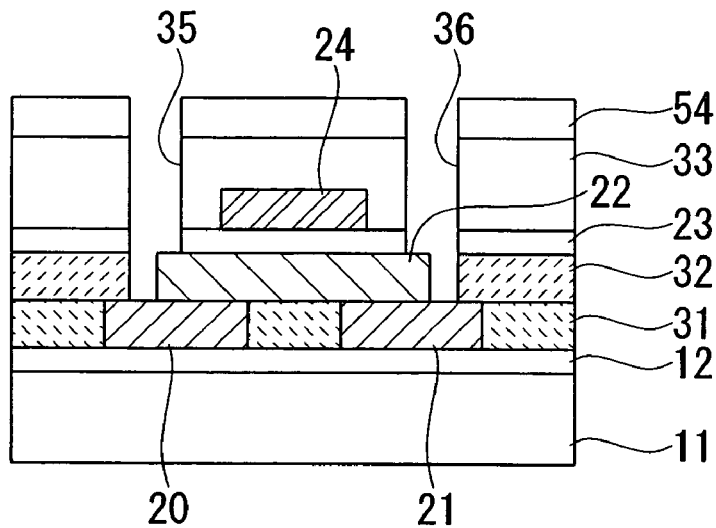
FIGS. 5A to 5C are views showing a manufacturing process of the transistor of the present invention.

Next, as is shown in FIG. 5A, by patterning using a photolithographic method or the like, unnecessary portions of the second insulating layer 32 and the third insulating layer 33 are removed to form the contact holes 35 and 36.

Namely, after the resist film 54 has been formed on the third insulating layer 33, unnecessary portions of the resist film 54 are removed by patterning, and unnecessary portions of the second insulating layer 32 and the third insulating layer 33 are further removed by etching.

Figure 5B:
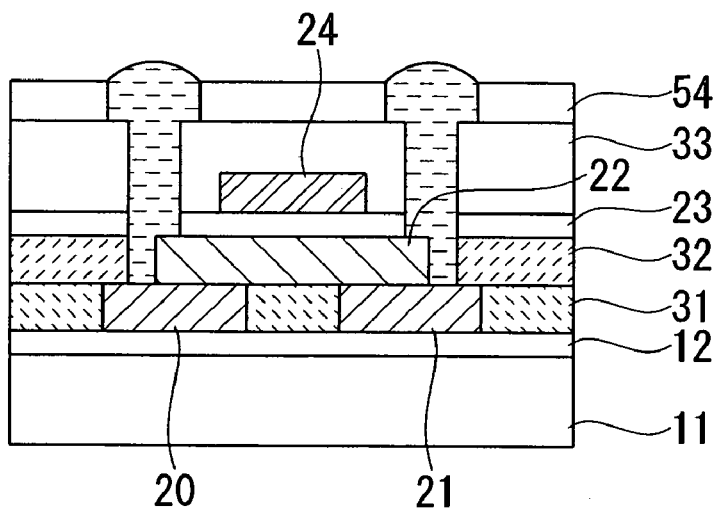

Next, as is shown in FIG. 5B, after the above described contact holes have been formed, unnecessary portions of the resist film 54 are removed by further patterning to form the areas (i.e., concave portions) for forming the source electrode and drain electrode. Subsequently, the material for forming the source electrode and drain electrode is placed in the formation areas. In the present example, a liquid material is used as the material for forming the source electrode and drain electrode and this liquid material is put in place using the above described droplet discharge method.

A liquid material obtained by dispersing fine particles of an electroconductive substance such as metal in a liquid (for example, an organic solvent) can be used as the liquid material for the source electrode and drain electrode. For example, a liquid material obtained by dispersing fine particles of silver having a particle diameter of 8 to 10 nm in an organic solvent such as terpineol or toluene can be used. In addition to the aforementioned silver (Ag), Au, Al, Cu, Ni, Co, Cr, ITO and the like can be used as the electroconductive fine particles.

After the liquid material has been put in place, solvent contained in the liquid material is removed by heat processing to form a solid electroconductive film. The temperature of this heat processing is preferably approximately the boiling point of the solvent, and may be set, for example, to 80 to 150° C. Note that the electroconductive film obtained at this time is an aggregate of electroconductive fine particles and is extremely reactive. Therefore, it is preferable that the heat processing is performed in a processing space formed by an inert gas atmosphere.

Figure 5C:
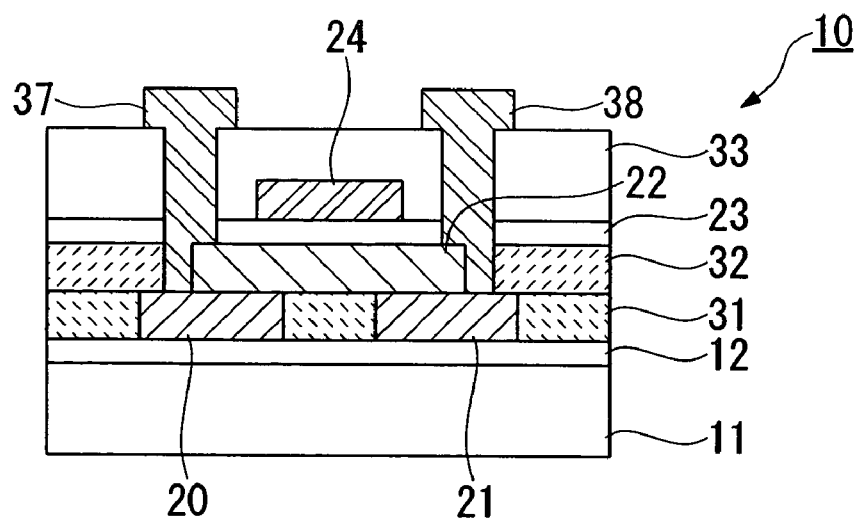

Next, as is shown in FIG. 5C, after the heat processing the resist film 54 is peeled off. Subsequently, the electroconductive film is baked by performing further heat processing. The temperature of the baking is, for example, 300 to 500° C. By performing this baking not only is the resistance value of the electroconductive film itself lowered, but contact resistance between conductive bodies (including semiconductors) is also lowered. As a result, a low resistance source electrode 37 and drain electrode 38 are formed and the transistor 10 shown previously in FIG. 1 is completed.

Note that electrodes formed by multiple layers of other types metals may also be used as the source electrode 37 and the drain electrode 38. For example, because base metals such as Al and Cu are comparatively easily oxidized in air a noble metal such as Ag or the like that does not easily oxidize in air may be formed on the top thereof. In addition, after the above electrodes have been formed, a protective layer (i.e., a protective insulating layer) may be formed on the topmost layer.

Figure 6:
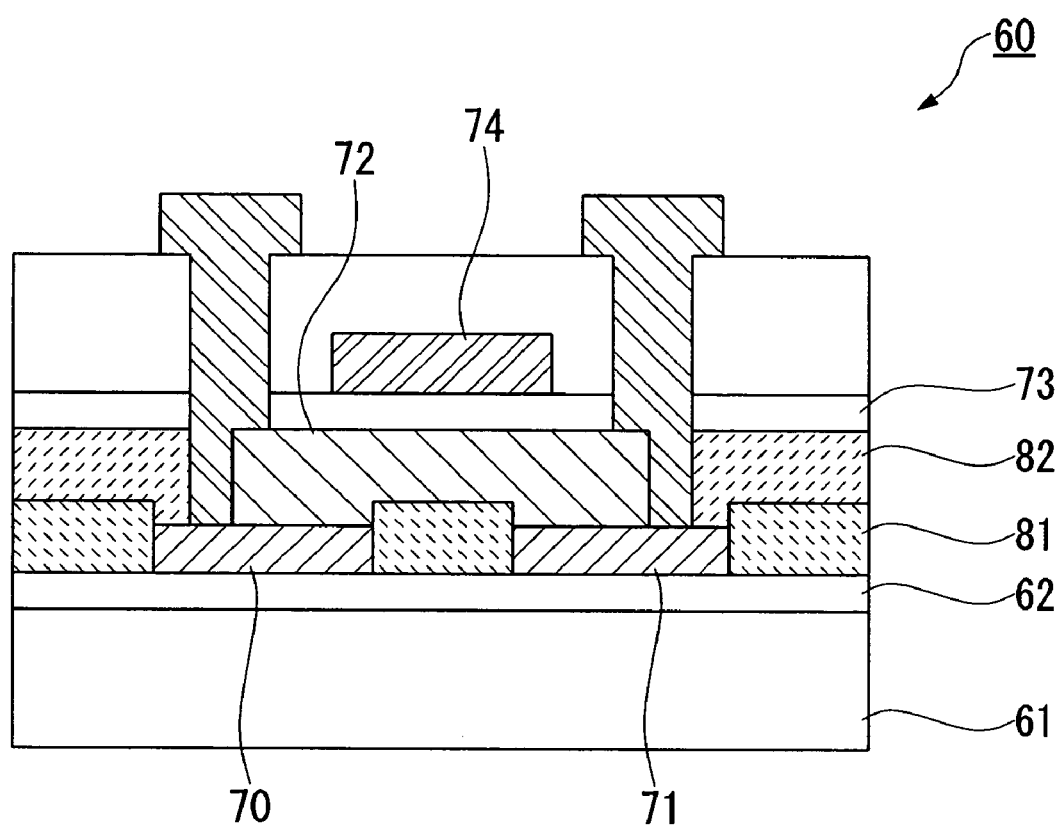
FIG. 6 is a typical cross-sectional view showing another example of an embodiment of the transistor according to the present invention.

FIG. 6 is a typical cross-sectional view showing another example of an embodiment of the transistor according to the present invention. In FIG. 6, a backing substrate 62 is formed on a substrate 61, and a transistor 60 is formed thereon using other crystalline silicon.

The transistor 60 of this example has substantially the same composition and structure as the transistor 10 shown previously in FIG. 1. Where it differs from the transistor 10 shown in FIG. 1 is that the surfaces of each of the silicon film 70 containing the source area and the silicon film 71 containing the drain area on the side of the silicon film 72 containing the channel area are slightly lower than the height of the first insulating layer 81.

As a result of this different structure, the transistor 60 of this example has the feature that the contact portion of the channel area 72 that connects to the source area 70 and the contact portion of the channel area 72 that connects to the drain area 71 are clearly separated. Accordingly, a more stable performance can be achieved.

Note that in the transistor 60 of this example the surfaces of the second insulating layer 82 and the silicon film 72 containing the channel area on the side of the gate electrode 74 are substantially the same height and, in the same way as the transistor 10 shown in FIG. 1, a flattening of the surface on which the gate insulating film 73 is formed is achieved. As a result, the gate insulating film 73 is flattened. By flattening the gate insulating film 73 any difference in level between the gate electrode 74 and any other wiring formed on top of the gate insulating film 73 is prevented, thereby providing a reduction in leakage current, a prevention of degradation, and an improvement in product quality.

Figure 7A:
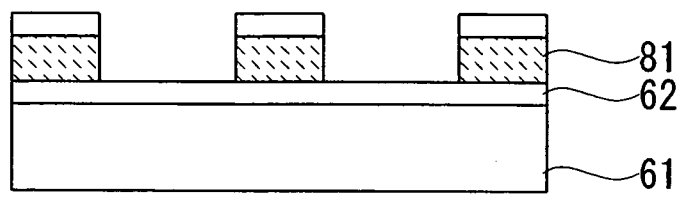
FIGS. 7A to 7C are views showing a manufacturing process of the transistor of the present invention.
Figure 7B:
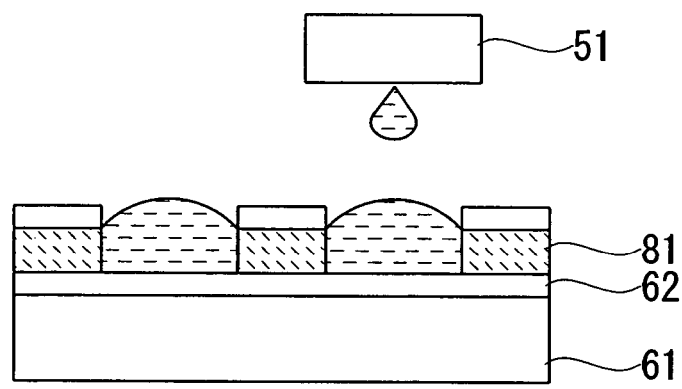
Figure 7C:
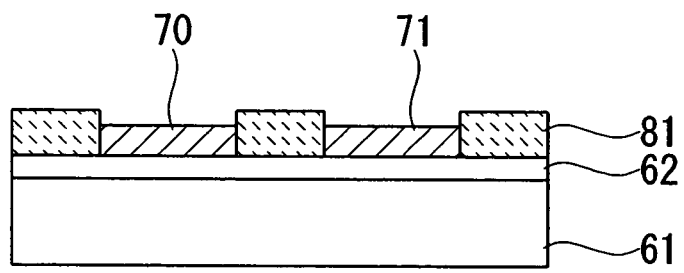

FIGS. 7A to 7C show a portion of a process to manufacture the above described transistor 60. In particular, the steps that differ from the example of the method to manufacture the transistor 10 explained in FIGS. 2 to 5 will be described.

In the manufacturing method of this example, as is shown in FIG. 7B, compared with the previous example, the quantity of the respective materials of the silicon film 70 containing the source area and the silicon film 71 containing the drain area that are put in place, namely, the total discharge quantities of the liquid material in the concave portions of the first insulating layer 81, which are the areas where these films are formed, is decreased. As a result, as is shown in FIG. 7C, in later heat processing the heights of the solidified silicon films 70 and 71 are slightly lower than the height of the first insulating layer 81.

Figure 8:
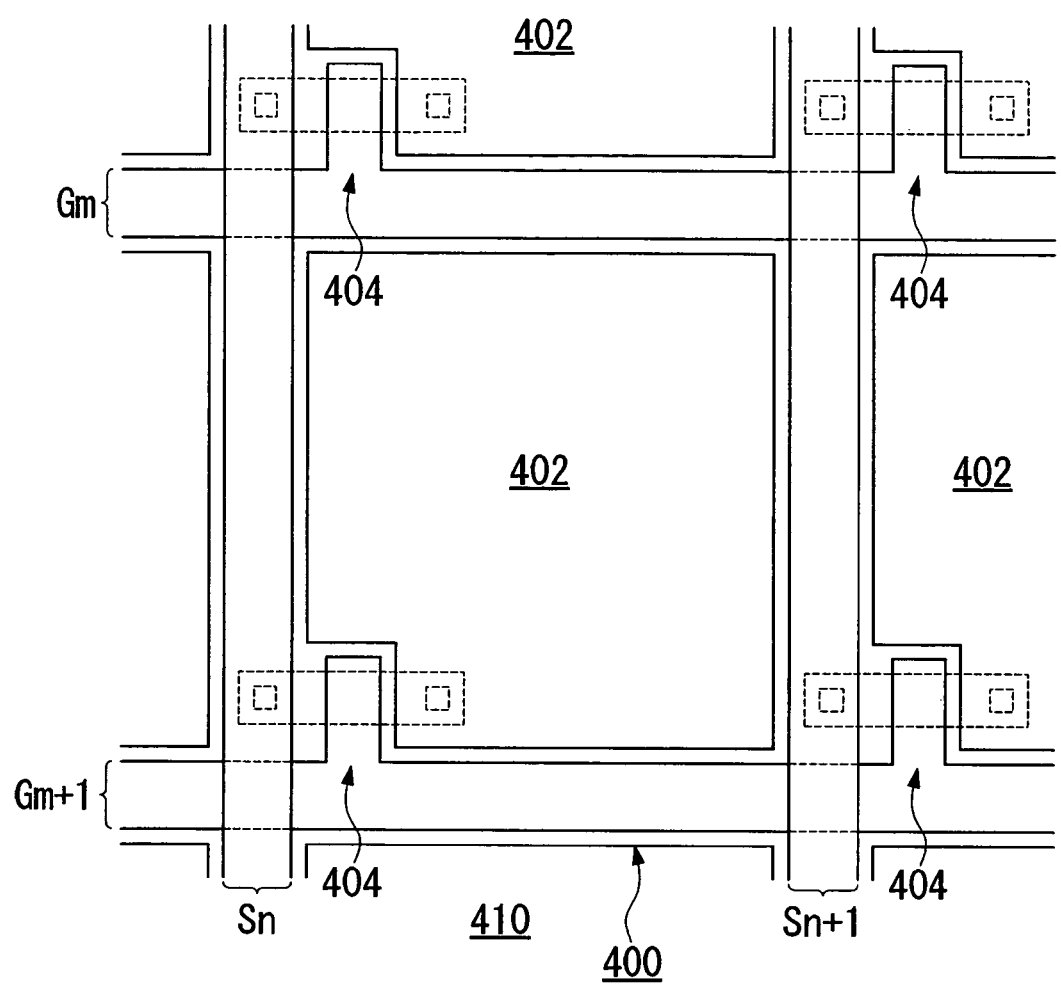
FIG. 8 is a plan view showing an enlarged portion of a pixel area formed in a block on an active matrix substrate for the liquid crystal display device of the present invention.

FIG. 8 is an enlarged plan view showing portion of a pixel area partitioned on an active matrix substrate for the liquid crystal display device of the present invention.

In FIG. 8, on an active matrix substrate 400 for a liquid crystal display device, the top of an insulating substrate 410 is divided into a plurality of pixel areas 402 by data lines Sn, Sn+1, . . . and scan lines Gm, Gm+1, . . . A transistor 404 in which the present invention has been applied is formed for each of the pixel areas 402. Therefore, using the substrate 400, in a liquid crystal display device it is possible to improve the degree of freedom when designing the transistor wiring structure, allowing an improvement in performance and product quality to be achieved.

Figure 9:
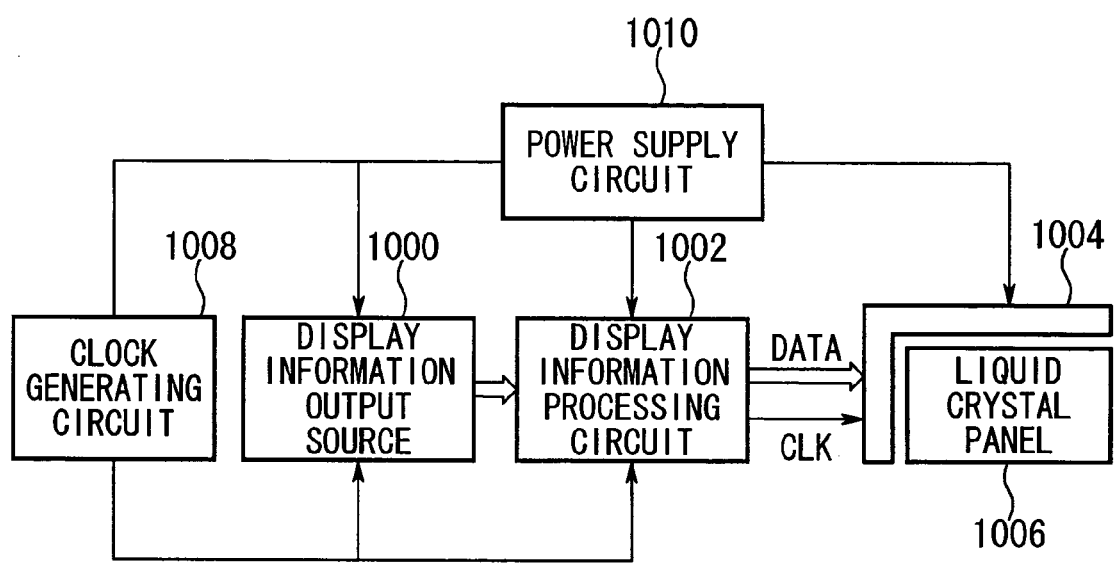
FIG. 9 is a block diagram showing a liquid crystal display device included in the electronic instrument of the present invention.

As is shown in FIG. 9, an electronic instrument formed using the above liquid crystal display device is constructed to include a display information output source 1000, a display information processing circuit 1002, a display drive circuit 1004, a display panel 1006 such as a liquid crystal panel, a clock generating circuit 1008, and a power supply circuit 1010.

The display information output source 1000 is constructed to include memory such as ROM or RAM, a tuning circuit that tunes and outputs television signals, and the like. The display information output source 1000 outputs display information such as video signals based on clocks generated by the clock generating circuit 1008. The display information processing circuit 1002 processes and outputs display information based on clocks generated by the clock generating circuit 1008. The display information processing circuit 1002 can, for example, include an amplification—polarity inversion circuit, a phase expansion circuit, a rotation circuit, a gamma correction circuit or clamping circuit or the like. The display drive circuit 1004 is constructed to include a a scan side drive circuit and a data side drive circuit and drives the display of the liquid crystal panel 1006. The power supply circuit 1010 supplies power to each of these circuits.

Figure 10:
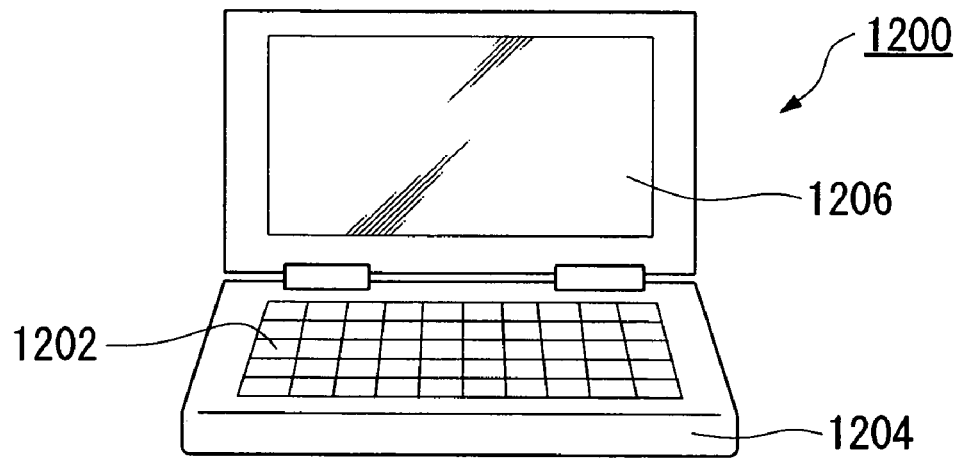
FIG. 10 is a schematic explanatory view of a personal computer that serves as an example of an electronic instrument that employs the liquid crystal display device of the present invention.

Examples of an electronic instrument having a structure such as this include a personal computer (PC) designed for multimedia applications such as that shown in FIG. 10, and an engineering work station (EWS), as well as liquid crystal projectors, pagers, mobile telephones, word processors, televisions, viewfinder type or direct monitor view type video tape recorders, electronic notebooks, electronic desk calculators, car navigation devices, POS terminals, and devices fitted with touch panels.

The personal computer 1200 shown in FIG. 10 is formed by a main body section 1204 that includes a keyboard 1202, and a liquid crystal display screen 1206 that includes the above described liquid crystal display device. Because the above described liquid crystal display device is used an improvement in display performance and product quality can be achieved.

Figure 11:
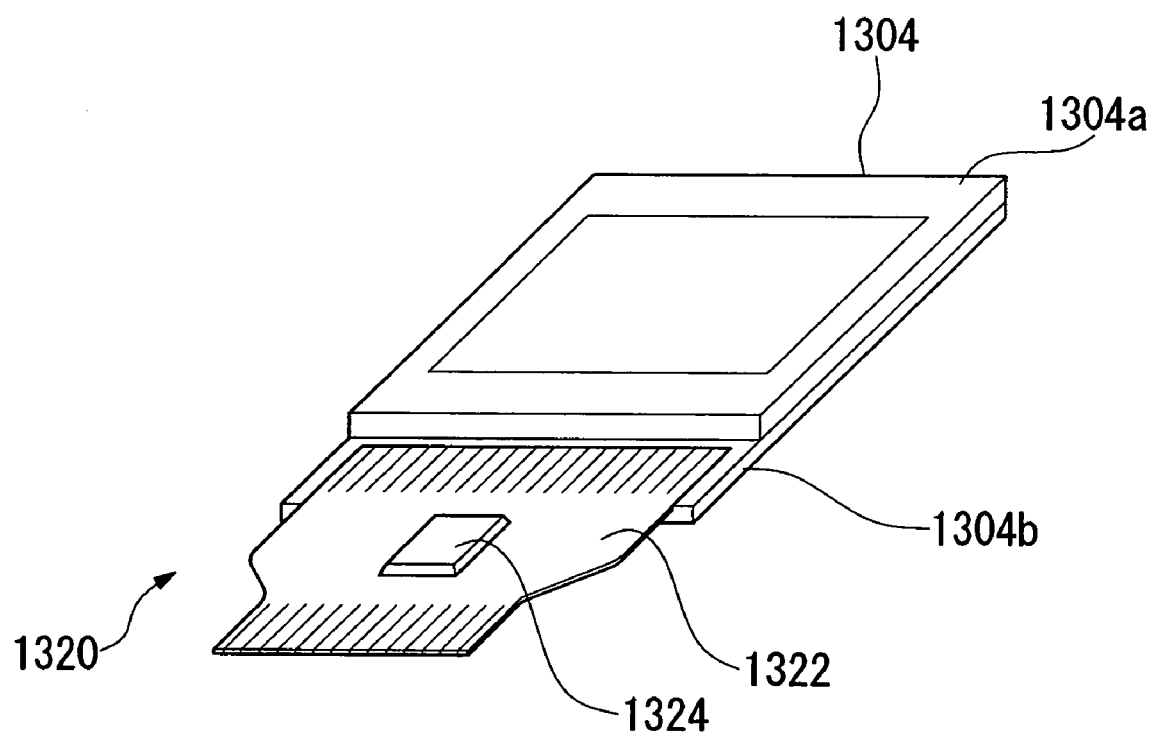
FIG. 11 is a schematic explanatory view showing a liquid crystal display device having a TCP.

Note that, as is shown in FIG. 11, instead of these it is also possible to connect a tape carrier package (TCP) 1320, in which an IC chip 1324 is packaged on a polyimide tape 1322 on which is formed a metal electroconductive film, to one of two transparent substrates 1304a and 1304b that form a liquid crystal display substrate 1304. This can then be used as a liquid crystal display device forming a part for an electronic instrument. By constructing an IC chip functioning as an integrated circuit using the transistor of the present invention, it is possible to improve the degree of freedom when designing the transistor wiring structure, allowing an improvement in performance and product quality to be achieved.

In the above described example a description is given of a TFT substrate as the active matrix substrate, however, the present invention can also be applied to other devices that use two terminal or three terminal elements as pixel switching elements such as MIM (metal-insulator-metal) and MIS (metal-insulator-silicon) devices. For example, the laminated thin film structure of an active matrix substrate that uses MIM can be constructed from an electroconductive layer and an insulating layer alone without a semiconductor layer being included, however, the present invention can be applied in this case as well. Furthermore, the present invention is not limited to active matrix substrates and can also be applied to devices that do not rely on liquid crystals as the display element, for example, those that use electroluminescence (EL). The present invention can also be applied to thin film devices having a variety of laminated thin film structures that include an electroconductive layer, and an insulating layer and also include a semiconductor layer, such as semiconductor devices having TFT, digital mirror devices (DMD), and the like.

What is claimed is:

1. An active matrix substrate comprising:
a substrate;
a backing insulating layer on the substrate;
a source portion formed over the backing insulating layer;
a drain portion formed over the backing insulating layer;
a first insulating film formed over the backing insulating layer, the first insulating film separating the source portion and the drain portion;
a semiconductor layer formed on at least a part of the source portion, at least a part of the drain portion, and at least a part of the first insulating film;
a gate insulating layer formed over the semiconductor layer; and
a gate electrode formed over the gate insulating layer.

2. The active matrix substrate according to claim 1, further comprising a second insulating film formed around the semiconductor layer, the second insulating film not being formed over the semiconductor layer.

3. The active matrix substrate according to claim 1, further comprising a source electrode contacting the source portion via a first contact hole, the first contact hole being formed at least in the gate insulating layer.

4. The active matrix substrate according to claim 1, further comprising a drain electrode contacting the drain portion via a second contact hole, the second contact hole being formed at least in the gate insulating layer.

5. The active matrix substrate according to claim 1, wherein a thickness of the first insulating film is larger than a thickness of the source portion.

6. The active matrix substrate according to claim 1, wherein the first insulating film is a separation wall surrounding the source portion.

7. The active matrix substrate according to claim 1, wherein the first insulating film includes a silicon oxide.

8. The active matrix substrate according to claim 1, wherein a thickness of a first part of the semiconductor layer on the source portion is different from a thickness of a second part of the semiconductor layer on the first insulating film.

9. The active matrix substrate according to claim 1, wherein a thickness of a first part of the semiconductor layer on the source portion is thinner than a thickness of a second part of the semiconductor layer on the first insulating film.

10. The active matrix substrate according to claim 1, wherein the gate electrode overlaps at least a part of the source portion.

11. An electro-optic device having the active matrix substrate according to claim 1.

12. An electronic instrument having the electro-optic device according to claim 11.

13. An active matrix substrate comprising:
an insulating substrate;
a source portion formed over the insulating substrate;
a drain portion formed over the insulating substrate;
a first insulating film formed over the insulating substrate, the first insulating film separating the source portion and the drain portion;
a semiconductor layer formed on at least a part of the source portion, at least a part of the drain portion, and at least a part of the first insulating film;
a gate insulating layer formed over the semiconductor layer; and
a gate electrode formed over the gate insulating layer.

14. The active matrix substrate according to claim 13, further comprising a second insulating film formed around the semiconductor layer, the second insulating film not being formed over the semiconductor layer.

15. The active matrix substrate according to claim 13, further comprising a source electrode contacting the source portion via a first contact hole, the first contact hole being formed at least in the gate insulating layer.

16. The active matrix substrate according to claim 13, further comprising a drain electrode contacting the drain portion via a second contact hole, the second contact hole being formed at least in the gate insulating layer.

17. The active matrix substrate according to claim 13, wherein a thickness of the first insulating film is larger than a thickness of the source portion.

18. The active matrix substrate according to claim 13, wherein the first insulating film is a separation wall surrounding the source portion.

19. The active matrix substrate according to claim 13, wherein the first insulating film includes a silicon oxide.

20. The active matrix substrate according to claim 13, wherein a thickness of a first of the semiconductor layer on the source portion is different from a thickness of a second part of the semiconductor layer on the first insulating film.

21. The active matrix substrate according to claim 13, wherein a thickness of a first part of the semiconductor layer on the source portion is thinner than a thickness of a second part of the semiconductor layer on the first insulating film.

22. The active matrix substrate according to claim 13, wherein the gate electrode overlaps at least a part of the source portion.

23. An electro-optic device having the active matrix substrate according to claim 13.

24. The active matrix substrate according to claim 13, further comprising:
  a backing insulating layer on the insulating substrate, wherein the source portion, the drain portion and the first insulating film are formed on the backing insulating layer.

* * * * *